(12) United States Patent
Mondello et al.

(10) Patent No.: US 11,984,177 B2
(45) Date of Patent: May 14, 2024

(54) MEMORY COMPONENT PROVIDED WITH A TEST INTERFACE

(71) Applicant: Micron Technology, Inc., Boise, ID (US)

(72) Inventors: Antonino Mondello, Messina (IT); Alberto Troia, Munich (DE)

( * ) Notice: Subject to any disclaimer, the term of this patent is extended or adjusted under 35 U.S.C. 154(b) by 0 days.

(21) Appl. No.: 17/957,274

(22) Filed: Sep. 30, 2022

(65) Prior Publication Data

US 2023/0025004 A1    Jan. 26, 2023

Related U.S. Application Data

(63) Continuation of application No. 16/625,234, filed as application No. PCT/IB2019/000476 on May 31, 2019, now Pat. No. 11,462,288.

(51) Int. Cl.
*G11C 29/12* (2006.01)

(52) U.S. Cl.
CPC ................ *G11C 29/1201* (2013.01)

(58) Field of Classification Search
CPC ........ G11C 29/1201; G11C 2029/0401; G11C 29/14
See application file for complete search history.

(56) References Cited

U.S. PATENT DOCUMENTS

| | | | |
|---|---|---|---|
| 6,122,762 A | 9/2000 | Kim | |
| 6,408,414 B1 * | 6/2002 | Hatada | G01R 31/318555 714/727 |
| 6,785,854 B1 | 8/2004 | Jaramillo et al. | |
| 7,073,110 B1 | 7/2006 | Jacobson | |
| 7,844,867 B1 | 11/2010 | Reddy et al. | |
| 9,640,280 B1 | 5/2017 | Arora et al. | |
| 2004/0128596 A1 | 7/2004 | Menon et al. | |
| 2007/0188183 A1 * | 8/2007 | Holtzman | G06F 21/72 380/264 |
| 2008/0079455 A1 | 4/2008 | Vollrath et al. | |
| 2014/0164725 A1 | 6/2014 | Jang et al. | |
| 2019/0205244 A1 * | 7/2019 | Smith | G06F 3/065 |

OTHER PUBLICATIONS

Partial International Search Report from related international application No. PCT/IB2019/000476, dated Dec. 3, 2019, 16 pages.
International Search Report and Written Opinion from related International application No. PCT/IB2019/000476, dated Jan. 27, 2020, 20 pages.

\* cited by examiner

*Primary Examiner* — Mohammed A Bashar
(74) *Attorney, Agent, or Firm* — Brooks, Cameron & Huebsch, PLLC

(57) ABSTRACT

A memory component comprises a memory unit including an array of memory cells, a controller of the memory unit, and a JTAG test interface including a plurality of contact pads adapted to connect the memory component with a host device and/or a test machine, wherein the test interface further comprises a plurality of test registers, which are configured to store the operating instructions for performing the test of the memory component, and wherein those test registers are organized in a matrix configuration, each row of the matrix being associated with a specific address. A related System-On-Chip device and a related method are further disclosed.

19 Claims, 6 Drawing Sheets

MEMORY COMPONENT PROVIDED WITH A TEST INTERFACE

PRIORITY INFORMATION

This application is a Continuation of U.S. application Ser. No. 16/625,234, filed on Dec. 20, 2019, which is a National Stage Application under 35 U.S.C. § 371 of International Application Number PCT/M2019/000476, filed on May 31, 2019, the contents of which are incorporated herein by reference.

TECHNICAL FIELD

The present disclosure relates to memory devices and more particularly to a memory component provided with a test interface.

BACKGROUND

Non-volatile Flash memories are today one of the fundamental building blocks in modern electronic systems, particularly for Real Time Operating Systems (RTOS). Generally, the operation of the non-volatile Flash memories is managed by a controller including an embedded firmware, such controller performing the required write/read/erase operations.

The performances of Flash memories in terms of speed, consumption, alterability, nonvolatility and the increasing importance of system reconfigurability have pushed up to now for their integration in System-on-Chip (SoC) devices.

A SoC is a semiconductor integrated circuit that integrates all components of a computer or other electronic systems. These components typically include a central processing unit (CPU), SoC controllers, memory portions, input/output ports and secondary storage components, all on a single semiconductor substrate. A SoC may contain digital, analog, mixed-signal, and often radio frequency signal processing functions, depending on the application. As they are integrated on a single electronic substrate, a SoC device may consume much less power and take up much less area than multi-chip designs with equivalent functionality. SoC devices are nowadays very common in the mobile computing, in embedded systems and in the Internet of Things (IoT).

Non-volatile memory portions embedded in SoCs, namely eFlash, are more and more difficult to be managed when the lithography node is below 28 nm. The increase demand of on-board memory in SoC is touching a physical limit and with the current technologies it is no longer convenient to use eFlash components with a size getting closer to that physical limit.

Therefore, there is a need for providing a new interface architecture that can be easily integrated in a SoC and improves the performances of non-volatile memories. At the same time, there is a need for efficiently testing such memories via the SoC or a dedicated testing machine, improving the interface between the memory and the SoC or the test machine.

DETAILED DESCRIPTION

With reference to those drawings, systems and methods involving a memory component (in particular including a non-volatile memory) provided with an improved test interface will be disclosed herein.

More particularly, as it will be described into details in the following, an example memory component comprises a memory unit including an array of memory cells, a controller of the memory unit, and a JTAG test interface including a plurality of contact pads adapted to connect the memory component with a host device and/or a test machine, wherein the JTAG test interface further comprises a plurality of test registers, which are configured to be loaded the operating instructions for performing the test of the memory component, and wherein those test registers are organized in a matrix configuration, each row of the matrix being associated with a specific address. A System-On-Chip (SoC) device comprising the above-mentioned memory component is also disclosed in the following.

Moreover, an example method for performing the test of a memory component of the type comprising a memory unit, which in turn includes an array of memory cells, comprises the steps of providing a plurality of test registers of the memory component, said test registers being organized in a matrix configuration, each row of the matrix being associated with a specific address, loading the operating instructions for performing the test of the memory component in the test registers, connecting pads of the memory component with a host device and/or a test machine, and addressing one or more test register for retrieving the test information via an output bus.

Non-volatile memories retain their contents when power is switched off, making them good choices for storing information that is to be retrieved after a system power-cycle.

A Flash memory is a type of non-volatile memory that retains stored data and is characterized by a very fast access time. Moreover, it can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages on the access and data lines.

Figure 1:
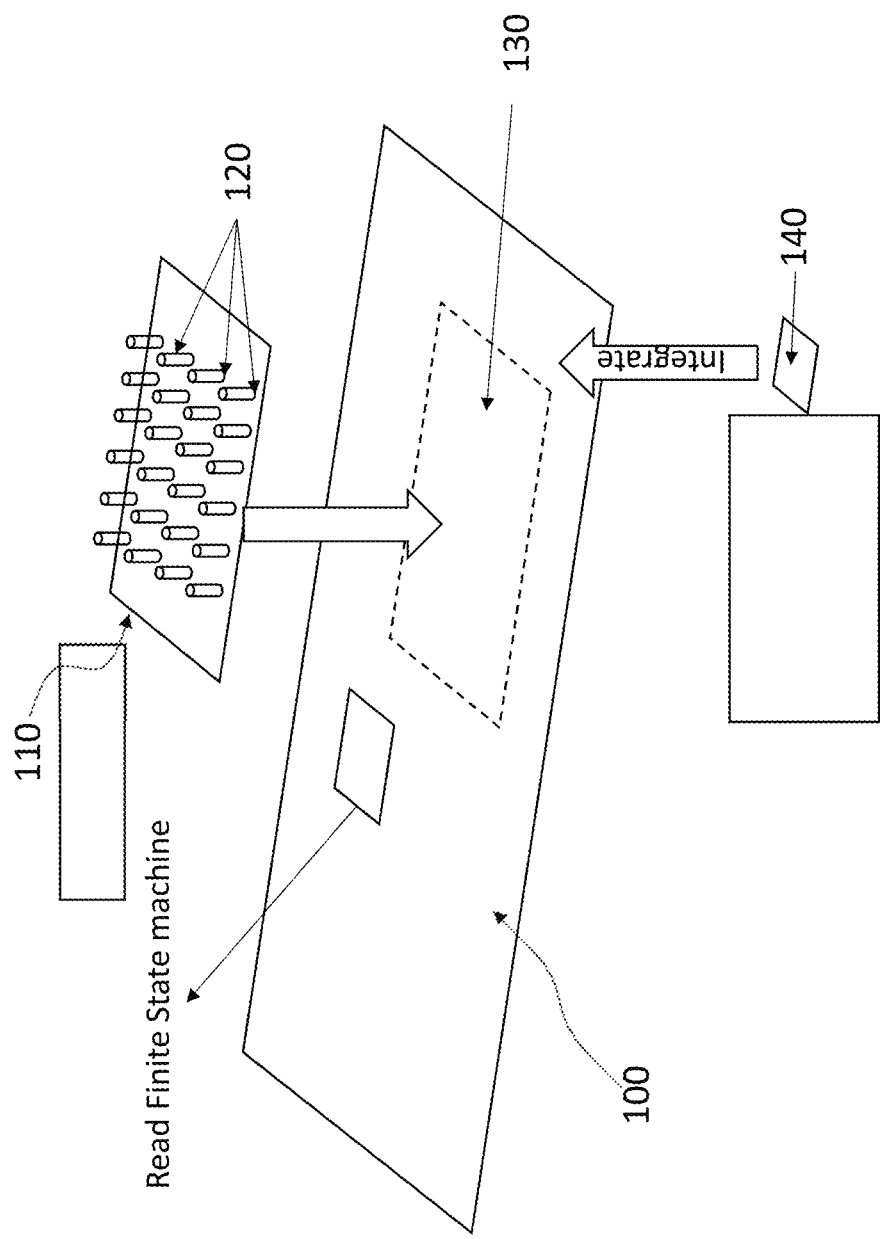
FIG. 1 is a schematic and perspective view of a System-on-Chip device according to the present disclosure and including a memory component replacing embedded memories of the prior art devices.

Flash memories can be associated to host devices. According to the present disclosure, as shown in FIG. 1, a SoC 100 is associated with a memory component 110. The SoC 100 and the memory device 110 are manufactured on a respective die obtained by a different lithography process.

Clearly, even more complex electronic devices coupled to the memory component can be provided without departing from the scope of the present disclosure.

According to the embodiment of FIG. 1, the SoC 100 is associated with the new structurally independent memory component 110 that is coupled to the SoC structure 100, for instance through a plurality of coupling elements 120, sometimes referred to as pads, such as pillars, through silicon vias (TSV), as well as ball on grid, flip-chip technology, wireless interconnection (coils) and the like. In a preferred embodiment, the coupling elements are pillars, which are arranged in a semiconductor area 130 previously dedicated to embedded traditional memory components.

More generally, the memory component 110 has a minor size if compared with the larger size of the SoC structure 100 and partially overlaps thereto, the term "partially overlapping" meaning that the memory component 110 can cover only partially or not completely the area of the SoC structure 100.

The coupling between the SoC structure 100 and the memory component 110 is made by interconnecting a plurality of respective pads or pin terminals that are faced one toward the other in a circuit layout that keeps the alignment of the pads even if the size of the memory component 110 is modified, as it will be disclosed in the following in more details.

Figure 2:
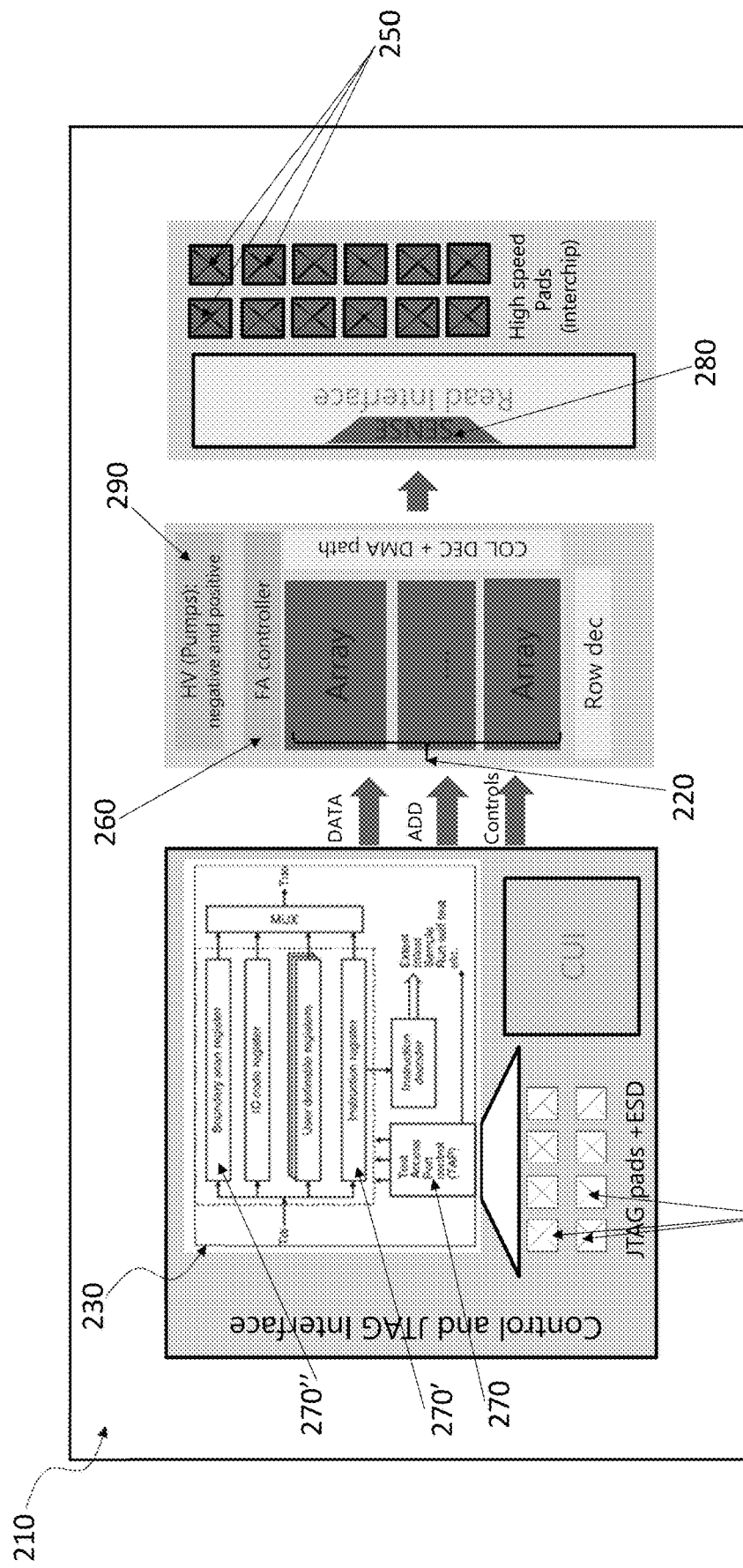
FIG. 2 is a scheme of the memory component according to the present disclosure.

Now, with more specific reference to the example of FIG. 2, the main structure of the memory component 210 according to an embodiment of the present disclosure will be disclosed, wherein the reference 210 of FIG. 2 corresponds to the memory component 110 of FIG. 1.

The memory component 210 includes at least an TO circuit, a micro-sequencer, an array of memory cells 220 and a circuitry located around the memory array, in particular an array peripheral, a charge pump architecture, address decoders, sense amplifiers 280 and corresponding latches, a service logic to connect all the parts of the memory, a command user interface, for instance a CUI block, as well as a JTAG interface, as will be disclosed in the following.

The array of memory cells 220 includes non-volatile Flash memory cells.

The memory array 220 of the memory component 210 is built as a collection of subarrays. The advantage of this architecture is that it is very scalable, wherein expanding and/or reducing the density of the final device translates only in mirroring a sub-array and generating the connection.

In one embodiment of the present disclosure, the memory component 210 implements a Direct Memory Access type of memory to replace the embedded memory array of known SoC devices.

Moreover, a JTAG interface 230 is adopted for the test and control of the memory component 210, allowing also the re-use of the testing tooling. Therefore, the memory component 210 comprises a JTAG logic.

At this regard, the memory component 210 comprises a plurality of JTAG pads 240 allowing the connection with an external testing machine, such JTAG pads 240 having the capability to manage high-voltage values, both positive and negative.

Clearly, the JTAG interface is also used in reading and programming operations.

Moreover, as previously mentioned, the memory component 210 comprises high-speed pads 250 allowing the interconnection with the SoC structure which the memory component 210 is associated with.

In one embodiment of the present disclosure, the arrangement of the pads 250 of the memory component 210 has been made on a surface of the memory component 210. More specifically, the pads 250 are arranged over the array so that, when the memory component 210 is reversed, they are faced to corresponding pads of the SoC structure. The semiconductor area that in known System-on-Chip devices was occupied by embedded non-volatile memory portions is now dedicated to the housing of the interconnecting pads corresponding to the pads 250 of the memory component 210. This area can be used for additional user mode interfaces and functionalities.

Even a memory component of a larger size may be supported and interconnected with the pads of the SoC structure, keeping the position and dislocation of its interconnecting pads.

Therefore, in the contest of the present disclosure, the SoC structure has its top side linked with the reversed side of the memory component 210, the pads of the SoC structure being aligned with matching pads 250 of the reversed memory component 210.

The memory component 210 is thus an independent structure but it is strictly associated to the host device, i.e. to the SoC structure.

As previously disclosed, the arrangement of the pads 250 of the memory component of has been made on a surface of the memory component, in practice on the top of the array. In any case, the schematic views of FIGS. 1 and 2 do not represent in scale the position and location of the pads 250 but it is just indicative. Moreover, just a reduced number of pads 250 is illustrated in FIG. 2.

The preferred configuration of the memory component according to the present disclosure therefore provides a face-to-face interconnection SoC/Flash array, wherein the sense amplifiers 280 of the memory component 210 are connected to the SoC in a Direct Memory Access configuration.

As seen before, the interconnections of the memory component 210 also include the JTAG interface 230 and the JTAG pads 240 for testing and other purposes.

In this manner, it is possible to keep relatively low the number of required interconnections.

Moreover, according to an embodiment of the present disclosure, the memory component 210 is equipped with a controller 260 of the flash array (hereinafter referred to as Flash array controller), said flash array controller 260 having an architecture that allows sharing some flash array resources with the SoC controller without compromising the secrecy of certain information stored therein (for example, algorithms, flash array voltages, currents, and more in general process information) and guarantees eventual customer return management.

Furthermore, advantageously according to the present disclosure, the test operations of the memory component 210 (hereinafter referred to also as "test-modes") are managed with a protocol based on the JTAG interface 230. The JTAG interface 230 is a special interface added to a chip, as known in the art, which is suitably modified to improve the test-modes.

More in particular, the test-modes can be managed by an external controller, such as the controller of the SoC which is external to the Flash array, or by an external test machine.

In any case, both the above-mentioned approaches are based on a Built-In Self Test (BIST) executed by the internal flash array controller 260, in this way maintain the secrecy of firmware portions relating to sensitive technological parameters (such as timing voltages, etc.), which are stored in the memory component 210 and shall not be shared with an external user.

The system controller accesses the JTAG interface through a first set of pads, such as pads 250, even if other configurations can be provided.

Generally, the pads 250 are not suitable to manage analog voltages. At this purpose, possible analog (high) voltages needed are managed by a dedicated module (not illustrated in the figures) of the memory component 210. Such module has the capability to generate and measure such analog values (voltage/currents).

On the other hand, the JTAG pads 240 are adapted to be connected with the probes of the test machine in order to test some special internal structures of the memory component 210, such as for instance the array 220. Such pads 240 generally have the capability to manage HV values, both positive and negative.

The test performed via the pads 240 extends the capability of the one based on system controller (i.e. with the pads 250) having the constraint of the maximum speed on data exchanged.

The JTAG interface 230 produces, as output data, addresses and control signals that are transferred to the internal flash controller 260. A memory address decoder is then used to drive the correct voltage in the desired address. The activity of the decoder is allowed by charge pumps 290 structured to keep secret the voltages and timings to manage the array. This decoder is coupled to a read interface that is in communication with the host or SoC device through a control and status bus. The output of the read interface is represented by the series of 168 Bit for each sub array 220. The implementation of this mechanisms ensures the optimization of the read operation of the memory array. The controller checks the operations updating a status register readable with the JTAG. A read finite state machine prepares the data for the SoC using the high-speed pads.

Figure 3:
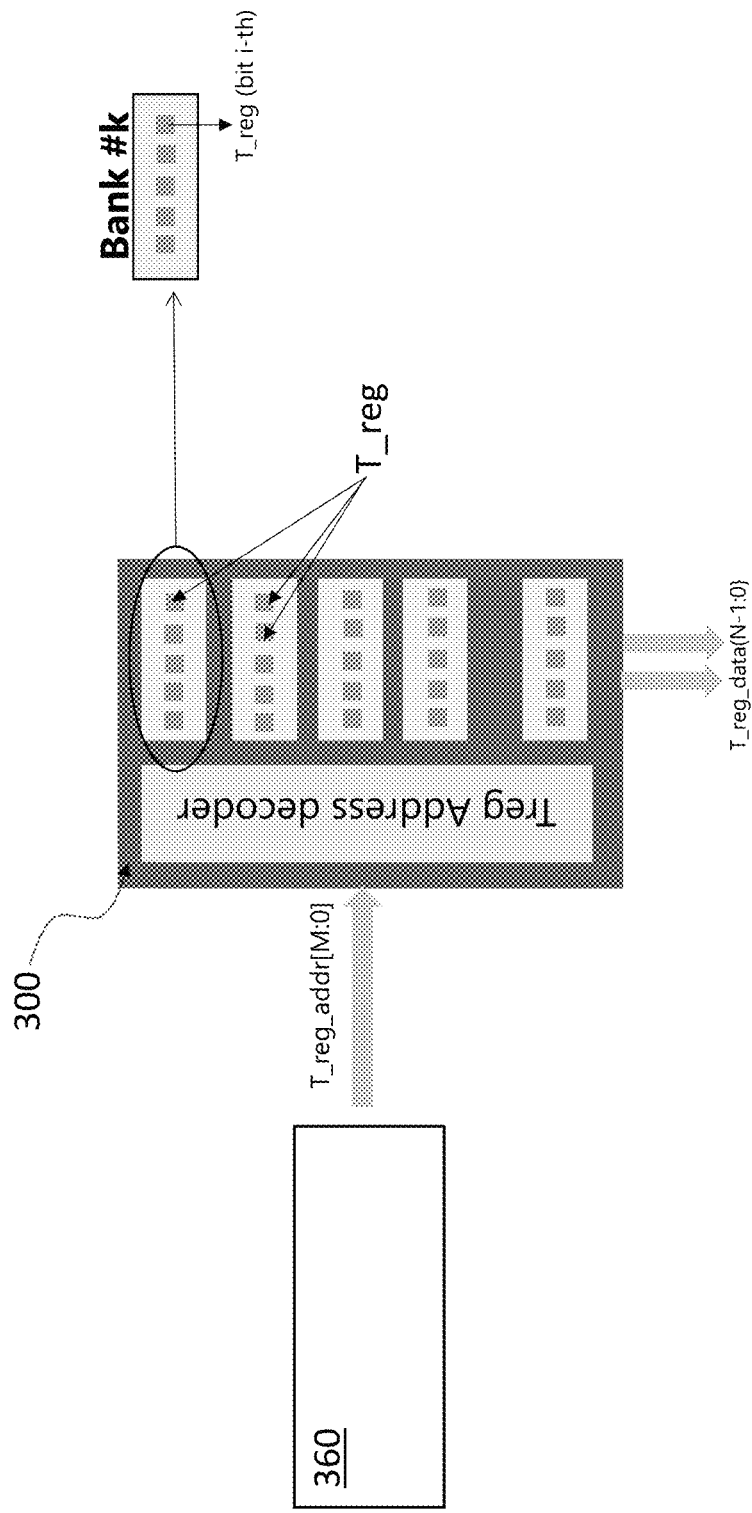
FIG. 3 is a schematic portion of a test interface of the memory component according to the present disclosure.

As shown in FIG. 3 in grater details, all the test approaches are based on a plurality (e.g. hundreds) of test registers (hereinafter referred to as T_reg) that can be written/read by the external controller (i.e. the SoC controller) via JTAG interface 230, by the test machine via the JTAG interface 230, and by the flash array controller 260 via internal buses.

In other words, according to the present disclosure, the memory component comprises a test interface including a plurality of contact pads adapted to connect the memory component with a host device and/or a test machine, such test interface further comprising a portion 300, operatively connected with the controller 360 (corresponding to the controller 260 of FIG. 2), in turn including the plurality of test registers T_reg, said test registers T_reg being configured to store the operating instructions for performing the test of the memory component. The test mode architecture of the memory component is therefore based on these registers.

The test registers T_reg therefore contain the instructions (e.g. parameters such as currents/voltages) for the test of the memory component. Generally, the test registers T_reg include not only voltages and current settings but also are able to enable special path inside the memory or BIST functions or other test variations.

According to the present disclosure, the test registers are organized in a matrix configuration, each row of the matrix being associated with a specific address. The controller 360 can thus access to specific rows of the matrix by selecting the specific address (hereinafter referred to as T_reg_addr).

In other words, the test registers T_reg are organized in several banks, each bank containing a certain number of registers (e.g. N=8, 16, etc.) and being associated with a specific address.

Each bank (i.e. each row of the matrix) is devoted to drive one or more macro function (Analog or Digital) for performing the test of the memory component. In this way, each register of the row corresponds to a single bit, as indicated in FIG. 3, each bit corresponding to a specific operation (sub-function). In other words, each row of the matrix is associated with a plurality of bits, each bit being associated with a sub-function (i.e. a particular test instruction).

Once the address is selected, the stored test instruction (T_reg_data) can be retrieved by a dedicated bus running on the various matrix columns.

For example, bank 0 can be devoted to Positive Read Charge Pump and each bit of the bank corresponds to a specific function, e.g., in case of banks containing 8 bits, bit 0=PUMP enable, bit 5:1=clock frequency, bit 7:6=drive capability (Max current). Also bank 1 can be devoted to Positive Read Charge Pump, e.g. bit 7:0=PUMP regulator output value, and so on. In this way, the various pumps are mapped via the various banks, each bit corresponding to a specific operation.

Other banks, such as for instance bank 12, can be dedicated to Sense Amplifiers, e.g. bit 0=Sense enable, bit 4:1=Delay BL pre-charge, bit 7:6=Sensing time, and so on.

The flash array controller 360 of FIG. 3 is thus interfaced with the plurality of test registers T_reg, each register being associated with the specific address of the bank T_reg_addr, allowing testing the functionality of the memory component, or generally for interfacing the memory component with a testing machine and/or an external controller in a very simple and effective manner.

The testing machine connects its probe lines with the JTAG pads 240 of FIG. 2 and communicates with the Flash array via Test Access Port (hereinafter referred to as TAP), namely via a set of dedicated pads used to interface the test machine with the memory component.

Figure 4:
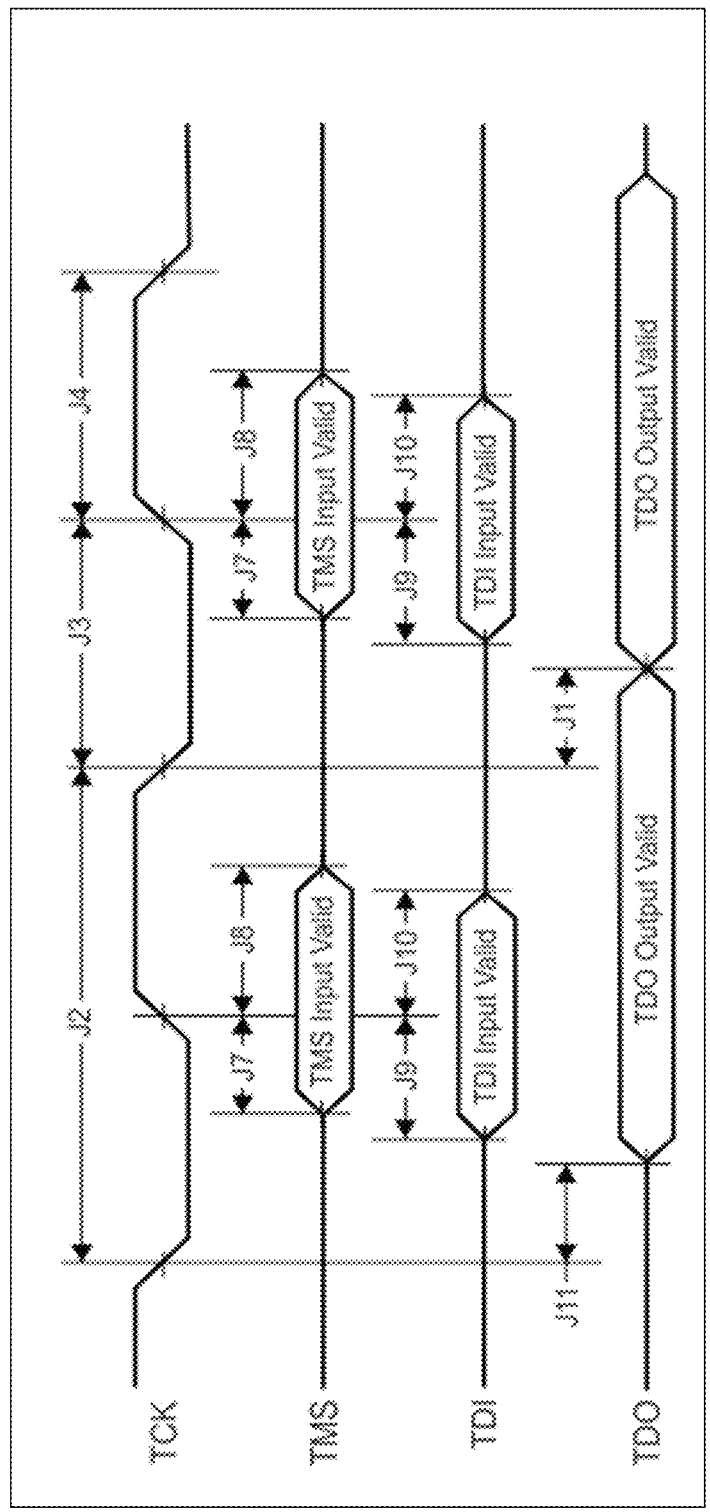
FIG. 4 is a scheme of typical test access port signals used by the test interface of the present disclosure.

Generally, four or five pads are used. In particular, according to the TAP of the present disclosure, the provided pads are Test Data In (TDI), Test Data Out (TDO), Test Clock (TCK), Test Mode Select (TMS), each being configured to receive a specific signal as shown in FIG. 4. Sometimes, an optional Test Reset (TRST) pad is used.

The TRST pad is an optional active-low reset to the test logic, usually asynchronous, but sometimes synchronous, depending on the chip. If the pad is not available, the test logic can be reset by switching to the reset state synchronously, using TCK and TMS. Note that resetting test logic doesn't necessarily imply resetting anything else. There are generally some processor-specific JTAG operations which can reset all or part of the chip being debugged.

Since only one data line is available, the protocol is serial. The clock input is at the TCK pad; the clock period is J2, while its semi-period is J3 or J4. One bit of data is transferred in from TDI (TDI Input Valid), and out to TDO (TDO Output Valid) at each TCK rising clock edge. Different instructions can be loaded. Instructions for typical ICs might read the chip ID, sample input pins, drive (or float) output pins, manipulate chip functions, or bypass (pipe TDI to TDO to logically shorten chains of multiple chips) and the like.

As with any clocked signal, data presented to TDI must be valid for some chip-specific Setup time (J9) before and Hold time (J10) after the relevant (here, rising) clock edge. TDO data is valid for some chip-specific time (J1) after the falling edge of TCK. TMS must be valid for some chip-specific Setup time (J7) before and Hold time (J8) after the relevant (here, rising) clock edge.

Referring again to FIG. 2, according to the present disclosure, the architecture also includes a finite-state machine, named TAP controller 270, with receives as inputs the three signals TCK, TMS, and TRST. The TAP controller is a 16-state final state machine that controls each step of the test operations.

For example, a boundary scan architecture can be employed and each instruction to be carried out by the boundary scan architecture is stored in an Instruction Register 270' operatively connected to the TAP controller 270.

This architecture also comprises a boundary-scan shift register 270" which is coupled to the TDI pin in serial mode and provides an output towards the TDO output pin via a multiplexer MUX. The test clock TCK is fed in via a dedicated input pin and the mode of operation is controlled by the TMS serial control signal both applied to the TAP controller 270. The various control signals associated with the instruction are then provided by a decoder.

The command user interface represented by the TAP controller 270 is based on the IEEE1149 and IEEE1532 standards, which implement a low signal count interface, i.e. with the TMS, TCK, TDI, TDO, TRST (Optional) pins with the capability to modify the internal content of the associated memory sub array.

The standard IEEE1149 is thus based on the TAP finite state machine, i.e the Tap controller 270, that includes sixteen states, and two of them, called shift instruction register (ShiftIR) and shift data register (ShiftDR), allows the interaction with the system in write and/or read.

More particularly, the shift data register ShiftDR reports a state where the TDI is connected with a register, wherein, in that state, the register content is transferred in and/or out of the device.

Similarly, the shift instruction register ShiftIR also reports a state where the TDI is connected with a register, wherein instructions are loaded in that state.

When the ShiftDR state is reached, the TDI and the TDO are connected to the register and, at each TCK, the data comes in from the TDI and out from the TDO.

The host device/test machine communicates using the TAP by manipulating TMS and TDI in conjunction with TCK and reading results through TDO (which is the only standard host-side input). TMS/TDI/TCK output transitions create the basic JTAG communication primitive on which higher layer protocols build.

More in particular, TMS only is the signal moving the TAP controller 270 at each edge of the clock. TDI is the data-in signal of the instruction and data register.

Therefore, in order to address the boundary scan, an instruction is loaded in the instruction register in the ShiftIR state; then boundary-scan register is internally selected.

At a basic level, using JTAG involves reading and writing instructions and their associated data test registers, as well as running a number of test cycles.

The JTAG pads use the TAP controller to provide instructions and data to the memory controller.

Moreover, additional pads are added to have capability to perform analog measurements and interact with the memory while the test machine is testing the die.

Figure 5:
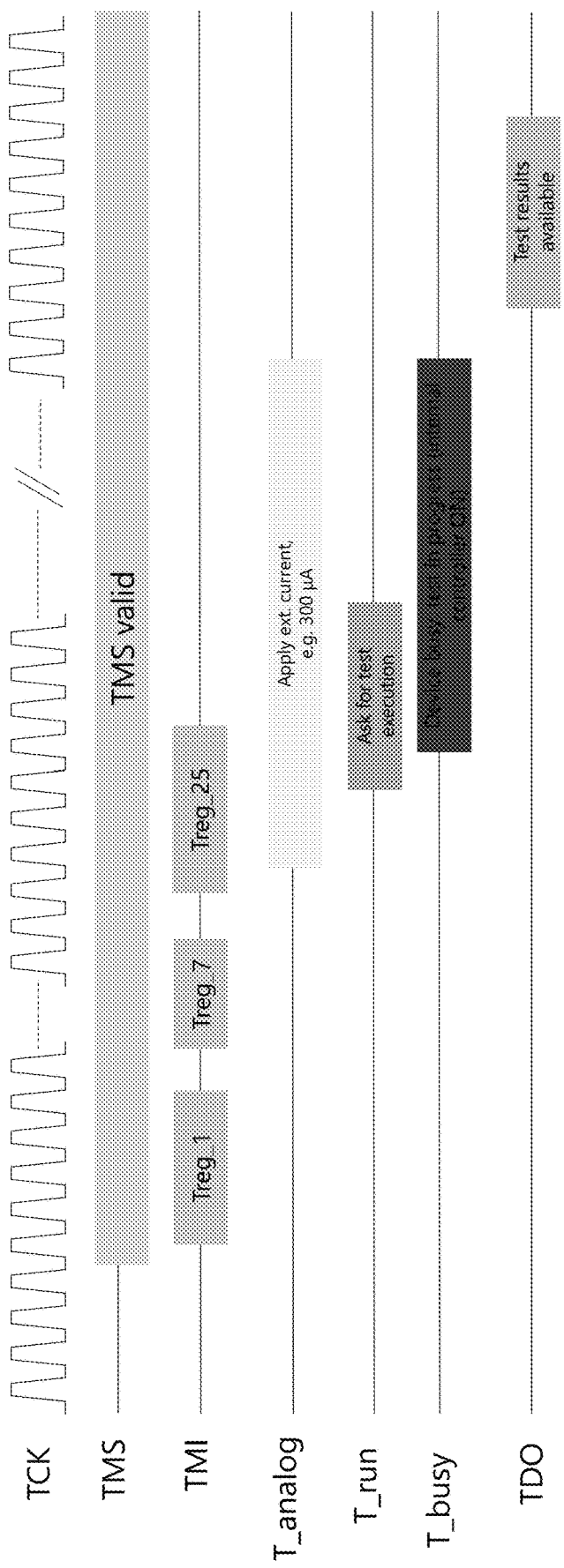
FIG. 5 schematically shows test signals sent to respective pads of the memory component of the present disclosure.

In particular, according to an embodiment of the present disclosure, as shown in FIG. 5, the JTAG interface further comprises at least one of an analog pad (T_analog), a pad for asking for test execution (T_run), and a device busy pad (T_busy, i.e. a pad indicating that the test is in progress and the internal controller is on). Furthermore, a bus for the initialization of the test registers (TMI, i.e. for setting some internal register), is provided.

More in particular, TMI refers to the register addressed by the JTAG, T_analog is an analog input to provide voltage or current to the device, T_run is used to trigger the start/continue of the test, and T_busy is an output of the memory and indicates that the memory is busy.

Therefore, in its most simple form, the pads of the test interface include at least: TDI, TDO, TCK, TMS, T_busy, T_analog, and T_run, as above described.

In this case, such additional pads improve the interface with the test machine and can be used to implement special test algorithms. More in particular, by using a suitable combination of T_run and T_busy, it is possible to communicate with the test interface some special test operations, while maintaining a low number of contact pads, as it will be described below. Moreover, this allows also the possibility of steps inside the same test, for instance an erase block by block can use a combination of T_run and T_busy to check all the blocks in a sub array.

Therefore, according to the present disclosure, the test machine is adapted to provide some bus cycle to load the internal registers T_reg, ask for the command execution T_run, wherein it polls the T_busy and waits for the command completion, possibly in a loop sequence. Finally, it collects the results by reading from the output lines, wherein such lines are previously set-up if they are in common with the internal ones. More in particular, the results are collected in JTAG registers and are then read.

The start of the test is therefore given by the signal of the T_run pad; the additional pins T_analog and T_busy are used as a mechanism to suitably interact with the test machine. In principle the test machine runs synchronously with the memory component to provide a proper analog signal to the memory component, using the busy status as interrupt.

This allows a better interface with the memory component, by using a suitable combination of said pads. For example, a combination of T_run, T_busy and T_analog may allow a test with different currents: when t_busy is low, a new current from T_analog can be applied, and then the T_run start again the test.

The memory component also comprises an efficient and secure ESD protection, improving the reliability of the component.

As previously mentioned, it can happen that the test in execution needs the measurement and/or generation of some current or voltages. Such operation can be done internally by using the dedicated analog module of the memory component.

Alternatively, the needed voltage/current can be applied by the testing machines by using the T_analog pad. This is useful also for debug purposes. Moreover, the T_analog can provide additional boost voltage or current to increase the modify speed.

Figure 6:
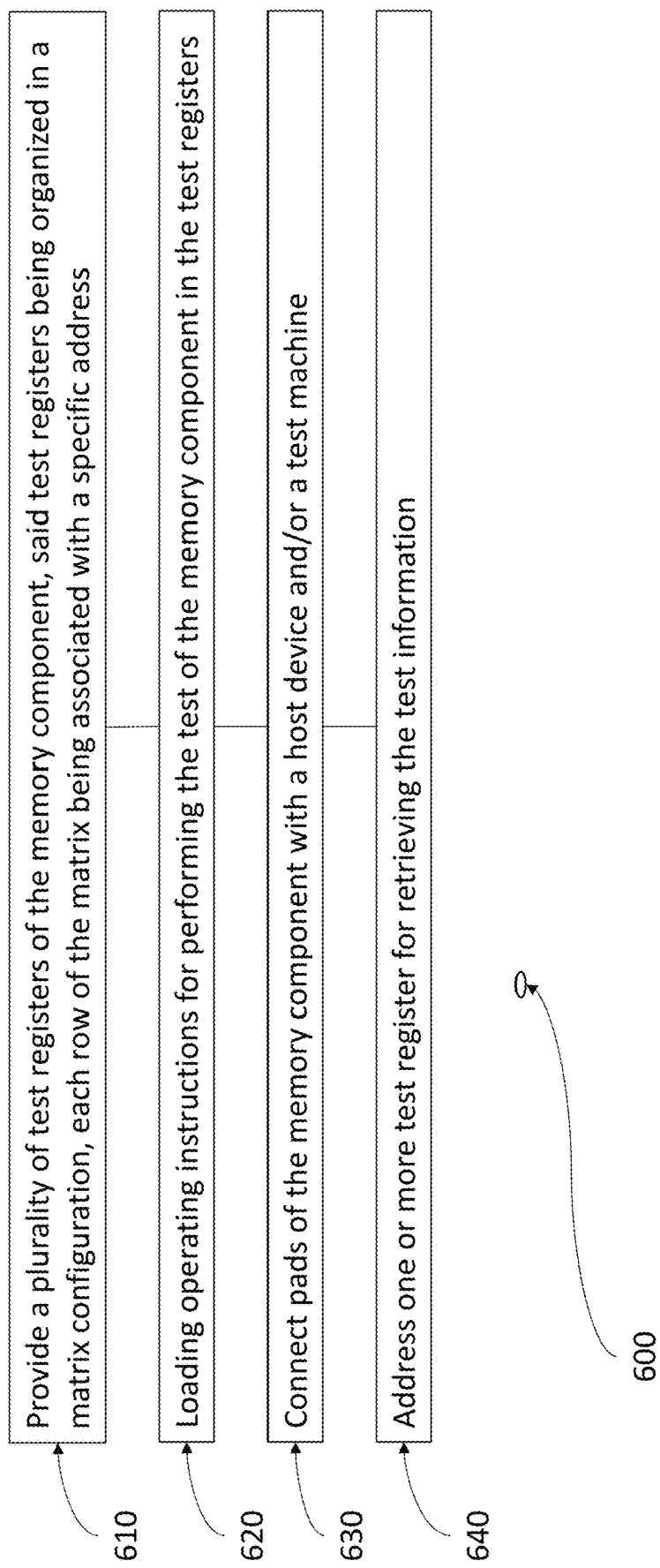
FIG. 6 shows a diagram of a method 600 according to the present disclosure.

FIG. 6 shows a diagram of a method 600 according to the disclosure. The method may be used to perform the test of a memory component of the type comprising a memory unit which includes an array of memory cells, such as the memory component of FIGS. 1, 2 and 3 described above.

At step 610, method 600 provides a plurality of test registers of the memory component, said test registers being organized in a matrix configuration, each row of the matrix being associated with a specific address; the plurality of test registers may be provided as described above with reference to FIGS. 1, 2 and/or 3.

At step 620, method 600 loads operating instructions for performing the test of the memory component in the test registers; operating instructions may be loaded as described in FIGS. 1-5 above.

At step 630, method 600 connects pads of the memory component with a host device and/or a test machine; pads of the memory component may be temporarily connected to a test machine, or the may be connected to a SoC 100 through a plurality of coupling elements, such as pillars, through silicon vias (TSV), as well as ball on grid, flip-chip technology, as described above with reference to FIG. 1, for example. In some cases a wireless interconnection may be established, instead.

At step 640, method 600 addresses one or more test register for retrieving the test information. This may be performed according to the description referring to FIGS. 1-5 above.

In some embodiments the method is performed through the JTAG protocol. The method may also comprise a step (not shown) of preventing the selection of specific test registers. In some embodiments such preventing the selection of specific test registers applies different restrictions according to different privileges of different users performing the test. In some embodiments the method is performed using at least one of an analog pad (T_analog), a pad for asking for test execution (T_run), and a device busy pad (T_busy), said pads being used in combination for interacting with the test machine.

Summing up, the test of the memory component according to the present disclosure is managed by a protocol based on the JTAG interface using the content of the test registers T_reg, said interface comprising pads for receiving the TAP signals, as well as other additional signals for managing the test operation. As previously observed, the test can be controlled by the SoC controller or by an external test machine.

According to an embodiment of the present disclosure, the test registers are in the form of latches or flip flop.

According to the present disclosure, two sets of registers are used: more specifically, the memory component comprises also configuration registers which are loaded with stored (non-volatile) information, such as bgap settings. In an embodiment, these configuration registers are loaded with information during the power up of the device.

On the other hand, the test registers are used in the test mode and are reset each time the component enters in user mode. The content of the test registers T_reg can be easily manipulated according to the user needs, and, in some circumstances, the content of said test registers can override the content of the configuration registers. Advantageously, the two sets of registers can be mixed together using a proper logic.

The non-volatile information can then be mapped in dedicated banks of registers, if needed, giving a great flexibility to the system.

In other words, both volatile and non-volatile information can be used during the test, the non-volatile information being stored in proper configuration registers. On the other hand, test registers can be initialized by the user with volatile data (used for configured the elements of the memory components) which are set each time a new test operation is initiated and usually are not maintained at the end thereof. Some of the registers can thus be loaded with content stored in a configuration block done with flash cells, others can be changed by the user for testing purpose, but not connected to factory configurations.

In this way, some registers of the memory component are adapted to be initialized with volatile information for the test mode, wherein some of these registers can be written by the user when he desires to perform a specific test operation; another class of registers is then adapted to be initialized with non-volatile information.

In this way, advantageously, the test registers T_reg are adapted to contain the test operating instructions (parameters, settings, special bit to allow path for signals for test purposes) at a basic level (user level), while higher layer test protocols are managed by the TAP controller and some others dedicated registers of the JTAG interface. Such high-level protocols do no need to be specified by the user during the test, and only the test register T_reg information can be used.

Moreover, according to an embodiment of the present disclosure, the controller of the memory component is configured to prevent the selection of specific test registers, in particular when the test mode is not operative.

More in particular, in order to allow the use of some test registers and to disable the access to other reserved test registers, the controller of the memory component comprises a filtering block. In this way, not all the test registers T_reg can be accessed by the external user, and the filtering block is configured to disable the access to some test registers T_reg on certain circumstances, e.g. if the user has not the required privileges to access to such test registers. Therefore, some reserved registers are not addressable, and the filter of the controller masks the specific address of such register, in such a way that the output of such filtering block yields only the first allowed register T_reg.

In one embodiment, some registers T_reg can never be accessed by the user firmware and can be accessed only by the manufacturer, which has the required privileges to execute a specific test-mode requiring the user of such forbidden register.

Moreover, the internal controller can be configured such that different restrictions for different users having different access privileges can be applied (i.e. different constraints on the test registers T_reg). In particular, the controller can receive additional inputs accounting for the particular test-mode to be performed, each test-mode being associated to a particular user having a specific privilege, allowing the controller to apply different restrictions for different users, as above indicated. It is thus possible to perform different test-modes with different privileges, and according to such privileges, the access to some registers is forbidden.

In other words, the filtering block can be configured differently based on the different users, which can be recognized by the controller during authentication, such controller thus configurating the filters accordingly. In this way, the memory component has different levels of testability: the manufacturer can have a complete access to the registers, while the SoC can have only a limited access. Different rights are linked to the authentication: depending on the recognized source of instruction, a portion of the test registers T_reg can be inhibited.

In conclusion, according to the present disclosure, test modes are performed in a very effective way by means of the plurality of test registers arranged in banks in the above-illustrated matrix configuration. According to the present disclosure, high level test protocols do not need to be known by the machine performing the test, which can access to the information of the test registers only by selecting the desired address. A low number of JTAG pads is maintained, simplifying tests in parallel.

The disclosed system is very versatile, permitting the user to implement a personal test interface, by using dedicated the test registers.

Moreover, the disclosed memory component obtains many other advantages reported hereinafter not in order of importance. The solution previously disclosed reduces the cost of the silicon for the memory component and improve the overall quality and reliability issues for the whole apparatus including the host device and memory component.

The present disclosure also allows an improved field testability, for example performed by the SoC using specific firmware released by the factory of the memory component.

The apparatus of the present disclosure offers a good option for performing the test of components of Real Time Operative Systems, especially in the Automotive segment.

Moreover, the combined use of the test pads allows an efficient interaction between the test machine and the memory component to be tested, maintaining a low number of pins and improving the overall test operation.

The memory component and the host or SoC have been coupled with an interface using a very high parallelism. This feature can be used also to improve the overall performances.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. An apparatus, comprising:
 a plurality of test registers configured to store operating instructions for performing a test of a memory component, wherein the operating instructions include current and voltage settings for performing the test;
 a memory component having an array of memory cells;
 a controller; and
 a JTAG test interface having a number of contact pads to connect the array of memory cells of the memory component with a host device and/or a test machine, wherein the number of contact pads include an analog pad to provide voltage or current to the memory component.

2. The apparatus of claim 1, wherein the JTAG test interface includes the plurality of test registers.

3. The apparatus of claim 1, wherein the plurality of test registers are organized in a matrix configuration.

4. The apparatus of claim 3, wherein the matrix configuration includes a plurality of rows, wherein each respective row is associated with a different address of the memory component.

5. The apparatus of claim 1, wherein the plurality of test registers comprise latches.

6. The apparatus of claim 1, wherein the plurality of test registers comprise flip flop circuitry.

7. An apparatus, comprising:
 a plurality of test registers configured to store operating instructions for performing a test of a memory component, wherein the operating instructions include a signal path in the memory component for performing the test;
 a memory component having an array of memory cells;
 a controller; and
 a JTAG test interface having a number of contact pads to connect the array of memory cells of the memory component with a host device and/or a test machine, wherein the number of contact pads include a pad to ask for test execution to trigger a start of a test of the memory component.

8. The apparatus of claim 7, wherein the apparatus is a system-on-chip device.

9. The apparatus of claim 7, wherein the memory component is a structurally independent semiconductor device.

10. The apparatus of claim 7, wherein the memory component includes a number of communication pads.

11. The apparatus of claim 7, wherein the controller is to perform reading and programming operations on the memory component using the JTAG test interface.

12. A method, comprising:
 loading operating instructions for performing a test of a memory component in a test register, wherein the memory component includes an array of memory cells, and the operating instructions include:
  current and voltage settings for performing the test; and
  a signal path in the memory component for performing the test; and
 performing the test of the memory component using a device busy pad that indicates that the memory component is busy.

13. The method of claim 12, wherein the method includes performing the test of the memory component using:
 an analog pad that provides voltage or current to the memory component; and
 a pad that asks for execution of the test.

14. The method of claim 12, wherein the method includes connecting pads of the memory component with a host device.

15. The method of claim 12, wherein the method includes connecting pads of the memory component with a test machine.

16. The method of claim 12, wherein the method includes addressing the test register to retrieve information associated with the test.

17. The method of claim 12, wherein the method includes loading the operating instructions for performing the test in the test register upon initiating a test mode for the memory component.

18. The method of claim 12, wherein the method includes performing the test using JTAG protocol.

19. The method of claim 12, wherein the method includes preventing selection of the test register by a user while the test is being performed.

* * * * *